United States Patent
Moll et al.

(10) Patent No.: US 9,673,115 B2
(45) Date of Patent: Jun. 6, 2017

(54) TEST STRUCTURES AND METHOD OF FORMING AN ACCORDING TEST STRUCTURE

(71) Applicant: GLOBALFOUNDRIES Inc., Grand Cayman (KY)

(72) Inventors: Hans-Peter Moll, Dresden (DE); Dieter Lipp, Görlitz (DE); Stefan Richter, Thalmassing (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1 day.

(21) Appl. No.: 14/933,107

(22) Filed: Nov. 5, 2015

(65) Prior Publication Data

US 2017/0133287 A1    May 11, 2017

(51) Int. Cl.

| | |
|---|---|
| *H01L 29/10* | (2006.01) |
| *H01L 21/66* | (2006.01) |
| *H01L 29/78* | (2006.01) |
| *H01L 29/06* | (2006.01) |
| *H01L 21/02* | (2006.01) |
| *H01L 21/283* | (2006.01) |

(52) U.S. Cl.
CPC ........ *H01L 22/32* (2013.01); *H01L 21/02488* (2013.01); *H01L 21/283* (2013.01); *H01L 29/0653* (2013.01); *H01L 29/78* (2013.01)

(58) Field of Classification Search
CPC ...................................................... H01L 22/32
See application file for complete search history.

(56) References Cited

U.S. PATENT DOCUMENTS

2013/0093020 A1* 4/2013 Zhu .................. H01L 21/84
257/347

* cited by examiner

*Primary Examiner* — Ajay K Arora
(74) *Attorney, Agent, or Firm* — Amerson Law Firm, PLLC

(57) ABSTRACT

The present disclosure provides a test structure which includes an SOI substrate having an active semiconductor layer, a buried insulating material layer, and a base substrate, wherein the active semiconductor layer is formed on the buried insulating material layer, which, in turn, is formed on the base substrate. The test structure further includes a contact which is formed on the active semiconductor layer and electrically coupled to the active semiconductor layer. Herein, the contact has a tip portion extending through the active semiconductor layer into the buried insulating material layer.

21 Claims, 10 Drawing Sheets

TEST STRUCTURES AND METHOD OF FORMING AN ACCORDING TEST STRUCTURE

BACKGROUND

1. Field of the Disclosure

The present disclosure generally relates to test structures and a method of forming an according test structure, and, more particularly, to test structures to measure a source/drain-contact-to-a-back-gate-voltage breakdown.

2. Description of the Related Art

For next generation technologies, semiconductor-on-insulator (SOI) technology is an attractive candidate to push forward the frontiers imposed by Moore's law. Particularly, fully depleted SOI (FDSOI) techniques seem to provide promising technologies that allow the fabrication of semiconductor devices at technology nodes of 28 nm and beyond. Aside from FDSOI techniques allowing the combination of high performance and low power consumption, complemented by excellent responsiveness to power management design techniques, the fabrication processes as employed in FDSOI techniques are comparatively simple and actually represent a low risk evolution of conventional planar bulk CMOS techniques.

In general, a MOSFET as fabricated by SOI techniques is a semiconductor device (MOSFET) comprising a gate structure (with a gate electrode and a gate oxide) formed on an SOI substrate, where a semiconductor layer, such as silicon, germanium or silicon germanium, is formed on an insulator layer, e.g., a buried oxide (BOX) layer, which, in turn, is formed on a semiconductor substrate material, such as silicon. Conventionally, there are two types of SOI devices: partially depleted SOI (PDSOI) and fully depleted SOI (FDSOI) MOSFETs. For example, in an N-type PDSOI MOSFET, a P-type film being sandwiched between the gate oxide (GOX) and the BOX layer is so large that the depletion region cannot cover the whole P region. Therefore, to some extent, PDSOI devices behave like bulk MOSFETS.

In FDSOI devices, the depletion region covers the whole semiconductor layer. Since, in FDSOI techniques, the semiconductor layer supports fewer depletion charges than the bulk, an increase in inversion charges occurs in the fully depleted semiconductor layer, resulting in higher switching speeds for FDSOI devices.

Compliance with Moore's law demands smaller ground rules for implementing ultra large scale integration (ULSI), as well as to further increase the integration density on a single chip, wherein increasingly scaled structures are formed in and above semiconductor substrates, leading to less space being available for device structures per footprint. Therefore, the continuing down-scaling of semiconductor devices to increasingly smaller scales raises various issues.

For example, an issue of FDSOI technologies at ULSI technology nodes, e.g., at 28 nm and beyond, is given by an increasing risk for "CA punch down" caused by misalignment of a source/drain contact (often referred to as "CA") relative to a source/drain region and a gate structure, respectively, or a pulled-back raised source/drain region. The "CA punch down" indicates a source/drain contact that punches through the source/drain region and at least partially extends into the BOX layer below the source/drain region. As a consequence, a spacing between the contact and an underlying upper surface of the base semiconductor substrate, particularly, in FDSOI techniques employing a back gate biasing, an upper surface of the back gate, may be reduced, resulting in a weak spot for dielectric breakdown and possibly a short between the source/drain contact and the back gate, where a short leads to a failure of the whole chip under fabrication.

An intermediate approach as presently followed in FDSOI introduction is represented as hybrid technology where all digital logic and memory devices exploit the benefits of FDSOI, while a few semiconductor device structures stay on bulk: for example, some analog or specific structures that designers prefer to keep on bulk for any reason (legacy, etc.)—assuming the power/performance/variability crisis faced at the next nodes is not too acute for such device structures.

In view of the above-described situation, it is, therefore, desirable to identify possible semiconductor devices having misaligned source/drain contacts and/or pulled-back raised source/drain regions for reducing the risk of dielectric breakdown and shorts in advanced semiconductor devices.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides, in a first aspect, a test structure. In accordance with some illustrative embodiments of the first aspect, the test structure includes an SOI substrate having an active semiconductor layer, a buried insulating material layer, and a base substrate, wherein the active semiconductor layer is formed on the buried insulating material layer, which, in turn, is formed on the base substrate. The test structure further includes a contact which is formed on the active semiconductor layer and electrically coupled to the active semiconductor layer. Herein, the contact has a tip portion extending through the active semiconductor layer into the buried insulating material layer.

The present disclosure provides, in a second aspect, a test structure. In accordance with some illustrative embodiments of the second aspect, the test structure includes an SOI substrate having an active semiconductor layer, a buried insulating material layer, and a base substrate, wherein the active semiconductor layer is formed on the buried insulating material layer, which, in turn, is formed on the base substrate. The test structure further includes a contact which is formed on the active semiconductor layer and electrically coupled to the active semiconductor layer, the contact having a tip portion which extends through the active semiconductor layer through the buried insulating material layer, an STI element formed at one side of the active semiconductor layer and being separated from the active semiconductor layer by the contact, the contact at least partially separating the STI element from the buried insulating material layer, an epi region epitaxially formed on the active semiconductor layer, and a silicide region provided in and on the epi region, wherein the contact is in contact with the silicide region, and wherein the tip portion extends through the epi region. Herein, the tip portion is laterally shifted relative to the silicide region.

The present disclosure provides, in a third aspect, a method of forming a test structure. In accordance with some illustrative embodiments of the third aspect, the method includes providing an SOI substrate having an active semiconductor layer, a buried insulating material layer and a base substrate, wherein the active semiconductor layer is formed on the buried insulating material layer, which, in turn, is formed on the base substrate, and forming a contact on the active semiconductor layer, the contact being electrically coupled to the active semiconductor layer. Herein, the contact has a tip portion extending through the active semiconductor layer into the buried insulating material layer.

BRIEF DESCRIPTION OF THE DRAWINGS

The disclosure may be understood by reference to the following description taken in conjunction with the accompanying drawings, in which like reference numerals identify like elements, and in which.

Figure 1A:
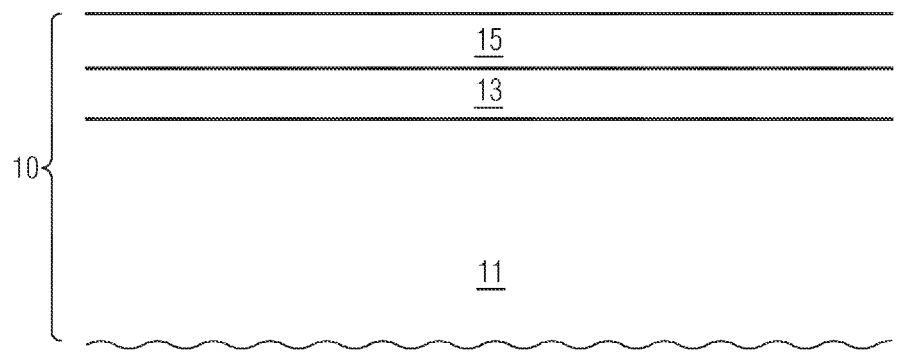
FIGS. 1a-1i schematically illustrate, in a cross-sectional view, a process of forming a test structure in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure may relate to a fabrication of a semiconductor device and to semiconductor devices, wherein the semiconductor devices are integrated on or in a chip. In accordance with some illustrative embodiments of the present disclosure, the fabricated semiconductor devices may substantially represent FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended. For example, semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

Semiconductor devices of the present disclosure concern devices which may be fabricated using advanced technologies, i.e., the semiconductor devices may be fabricated by technologies applied to approach technology nodes smaller than 100 nm, for example, smaller than 50 nm or smaller than 35 nm, e.g., at 28 nm or below. After a complete review of the present application, the person skilled in the art will appreciate that, according to the present disclosure, ground rules smaller or equal to 45 nm, e.g., at 28 nm or below, may be imposed, but that the present invention is not limited to such examples. After a complete review of the present application, the person skilled in the art will also appreciate that the present disclosure may be employed in fabricating semiconductor devices with structures of minimal length dimensions and/or width dimensions smaller than 100 nm, for example, smaller than 50 nm or smaller than 35 nm or smaller than 28 nm. For example, the present disclosure may provide semiconductor devices fabricated by using 45 nm technologies or below, e.g., 28 nm or even below.

In general, SOI devices have an active semiconductor layer disposed on a buried insulating material layer, which, in turn, is formed on a base substrate. In accordance with some illustrative embodiments of the present disclosure, the active semiconductor layer may comprise one of silicon, germanium, silicon germanium and the like. The buried insulating material layer may comprise an insulating material, e.g., silicon oxide or silicon nitride. The base substrate may be formed by a material that is conventionally used as a substrate, e.g., silicon and the like. After a complete review of the present application, the person skilled in the art will appreciate that, in accordance with illustrative embodiments employing FDSOI substrates, the active semiconductor layer may have a thickness of about 20 nm or less, while the buried insulating material layer may have a thickness of about 145 nm or, in accordance with advanced techniques, the buried insulating material layer may have a thickness in a range from about 10-30 nm. For example, in some special illustrative embodiments of the present disclosure, the active semiconductor layer may have a thickness of about 6-10 nm.

As to a crystallographic plane orientation of the base substrate, similar to that of an ordinary silicon device, an SOI substrate whose surface is a face (100) may be used. However, in order to improve the performance of a PMOS semiconductor device, a surface of the PMOS semiconductor device may be used as a face (110). Alternatively, a hybrid plane orientation substrate whose surface may be mixed by a face (100) and a face (110) may be used. For example, if a varactor device is to be formed on an SOI substrate, a crystal plane orientation may not be restricted such that an impurity concentration, film thickness, dimension ratio of the device and the like can be appropriately adjusted to obtain a capacitance characteristic that is suitable according to the plane orientation set by other requirements. Alternatively, the base substrate of an SOI substrate may be of an N-type when N-accumulation and/or N-inversion devices are considered (otherwise P-type for P-accumulation and/or P-inversion).

FIG. 1a schematically illustrates an SOI substrate 10 which is provided, as described above, by a base substrate 11, a buried insulating material layer 13 and an active semiconductor layer 15. Herein, the active semiconductor layer 15 is formed on the buried insulating material layer 13, which, in turn, is disposed on the base substrate 11. The SOI substrate may be, for example, formed in accordance with known techniques, such as smart cut or SIMOX fabrication processes.

In accordance with an illustrative example, the active semiconductor layer 15 may be provided by a semiconductor material, e.g., silicon or silicon germanium. In accordance with some special illustrative examples, silicon germanium regions, so called embedded silicon germanium (eSiGe), may be formed in the active semiconductor layer 15 at PMOS device areas. For example, eSiGe may be formed by forming a patterned mask layer on the active semiconductor layer 15, where PMOS device areas are exposed to further processing, and subsequently depositing silicon germanium over the patterned mask layer. By means of an annealing process, silicon germanium is driven from the deposited silicon germanium layer into the active semiconductor layer 15 below and a silicon germanium comprising active semiconductor region is formed, on which a silicon oxide layer portion is formed. Afterwards, in removing the patterned mask layer and the silicon oxide layer portion, the active semiconductor layer 15 having eSiGe regions is left. Although eSiGe regions are not explicitly shown in the figures, the person skilled in the art will appreciate that eSiGe regions may be formed in the active semiconductor layer 15 prior to the formation of gate structures.

In accordance with some examples, the active semiconductor layer 15 may have a thickness in a range from about 5-10 nm. In accordance with some illustrative embodiments of the present disclosure, the buried insulating material 13 may be a silicon oxide material and may have a thickness in a range from about 10-30 nm, alternatively the thickness may be in a range from 130-160 nm, e.g., at about 149 nm. In accordance with some illustrative embodiments, the base substrate 11 may be formed by silicon or any other appropriate semiconductor material used as a bulk substrate material.

Figure 1B:
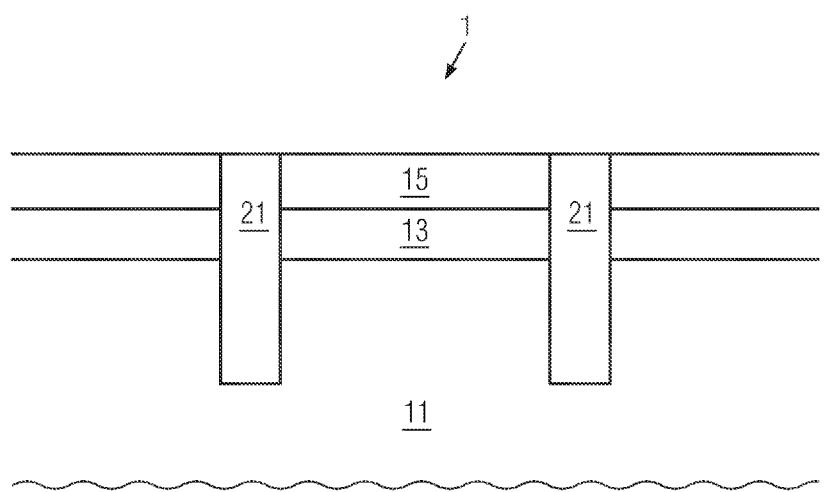

FIG. 1b schematically illustrates the SOI substrate 10 of FIG. 1a at a more advanced stage during fabrication after trench isolation structures 21 are formed to delimit one or more SOI regions for forming at least two active regions, such as an SOI region 1 being surrounded by the trench isolation structures 21. For example, at least the SOI region 1 may be disposed at a scribe line of a wafer. In accordance with some illustrative examples herein, the SOI region 1 may totally or partially lie within a scribe line or may represent the active region of a semiconductor device, such as a MOSFET device, to be fabricated.

Referring to FIG. 1b, the trench isolation structure 21 may be formed in accordance with known shallow trench isolation (STI) techniques by etching trenches into the SOI substrate and filling the trenches with an insulating material, e.g., one of silicon oxide and silicon nitride. In accordance with some illustrative embodiments herein, in filling the trenches with the insulating material for forming the trench isolation structure 21, the trenches may be over-filled such that the trench isolation structure 21 may be higher than an upper surface level of the surrounding active semiconductor layer 15.

Figure 1C:
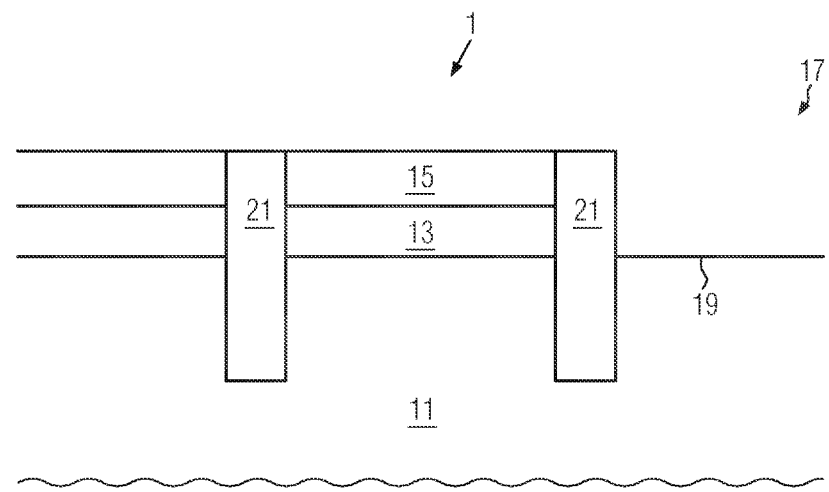

FIG. 1c schematically illustrates the SOI substrate of FIG. 1b at a more advanced stage during fabrication after a bulk exposed region 19 is formed. The bulk exposed region 19, which partially exposes an upper surface of the base substrate 11, may, for example, be formed by appropriately masking the SOI substrate 10 in FIG. 1a and by removing the buried insulating material layer 13 and the active semiconductor layer 15 in accordance with the masking, for example, by applying an anisotropic etching process for etching a trench 17 into the active semiconductor layer 15 and the buried insulating material layer 13 adjacent to the SOI region 1 in alignment with the STI structure on the right hand side in FIG. 1c. The bulk exposed region 19 may represent a bottom of the trench 17. Accordingly, hybrid structures may be formed where an FDSOI device structure is formed in and above the SOI region 1 and a bulk device is formed in and above the exposed bulk region 19.

Figure 1D:
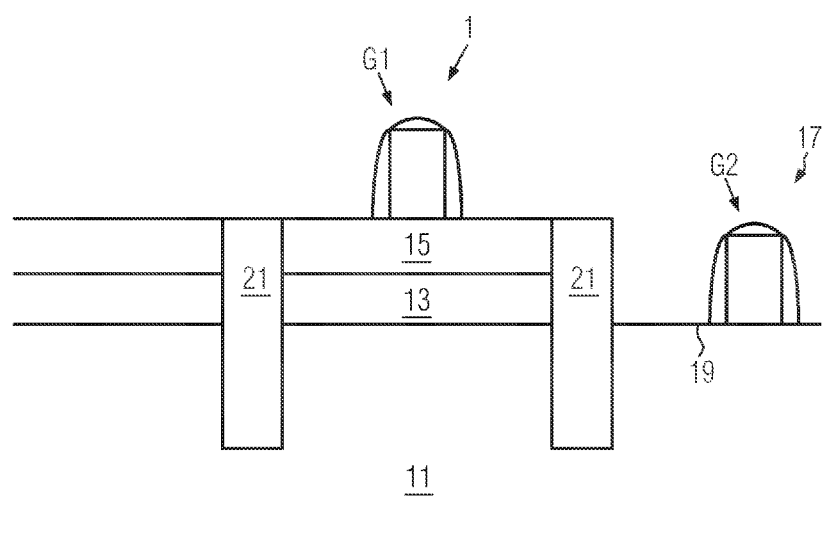

FIG. 1d schematically illustrates the structure as depicted in FIG. 1c at a more advanced stage during fabrication after (optional) gate structures G1 and G2 are formed above the SOI region 1 and the bulk exposed region 19 within the trench 17. Each of the gate structures G1 and G2 may comprise a gate dielectric structure, e.g., comprising at least one of a silicon oxide material and a high-k material (e.g., hafnium oxide and the like), and a gate electrode material, such as polysilicon, amorphous silicon or a metal material apt for use as a gate electrode material. The gate dielectric structure and the gate electrode material may be encapsulated by a spacer structure as known in the art, the spacer structure comprising sidewall spacers and a cap structure. In accordance with some illustrative embodiments of the present disclosure, at least one of the gate structures G1 and G2 may be formed in accordance with known gate-first techniques or, alternatively, gate-last or replacement gate techniques.

This does not pose any limitation to the present disclosure and gate structure G1 and/or G2 may be omitted such that an according test structure does not have the gate structure G1 and/or the gate structure G2.

Figure 1E:
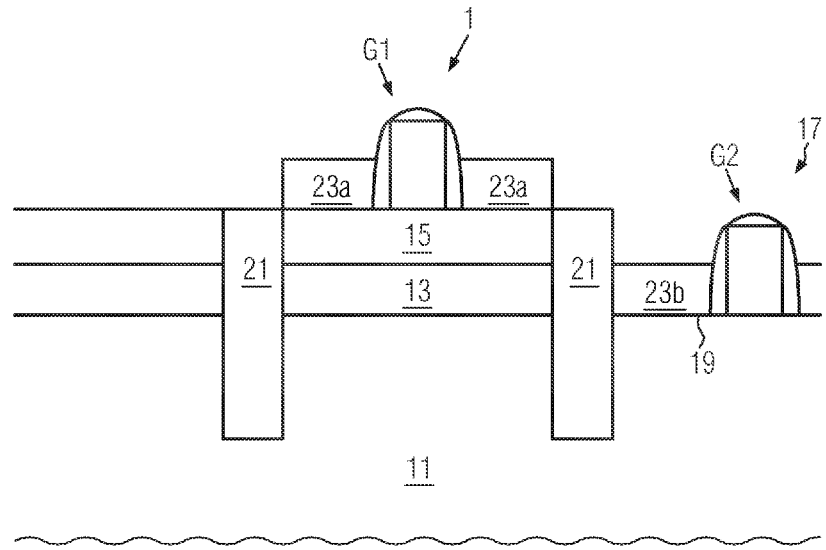

With regard to FIG. 1e, the structure as described above with regard to FIG. 1d is schematically illustrated at a more advanced stage during the fabrication after a possible epitaxial growth process was performed in order to epitaxially grow a semiconductor material on the active semiconductor layer 15. In accordance with some illustrative embodiments, epi regions 23a are formed on the active semiconductor layer 15 in alignment with the gate structure G1 in the SOI region 1, while epi regions 23b are formed on the exposed bulk substrate in the bulk exposed region 19 within the trench 17 in alignment with the gate structure G2.

In accordance with some illustrative embodiments of the present disclosure, one of silicon, silicon germanium and silicon carbide may be formed on the active semiconductor layer 15 and one of silicon, silicon germanium and silicon carbide may be formed on the bulk exposed region 19 within the trench 17. This, however, poses no limitation to the present disclosure and the person skilled in the art will appreciate that the process for forming raised source/drain regions as described above with regard to FIG. 1e is optional and may be omitted in some illustrative embodiments of the present disclosure.

Figure 1F:
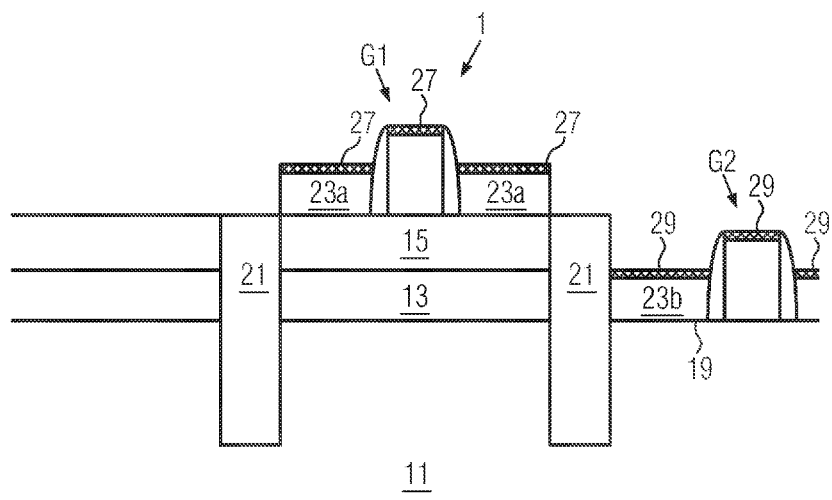

With regard to FIG. 1f, the structure as described above with regard to FIG. 1e is schematically illustrated at a more advanced stage during the fabrication after a salicidation (self-aligned silicidation) process (not illustrated) is performed and completed. As a result, silicide regions 27 may be formed in and on the epi regions 23a in the SOI region 1 and silicide regions 29 may be formed in and on the epi regions 23b in the trench 17.

In some illustrative embodiments of the present disclosure, the salicidation process may comprise a step of removing cap structures of the gate structures G1 and G2, a step of depositing a metal material (not illustrated) over the structure as illustrated in FIG. 1e and, subsequently, performing an annealing process for forming the silicide regions 27 and 29 by inducing a reaction of semiconductor material with the deposited metal material (not illustrated). Subsequently, an etching process may be performed for removing the unreacted metal material leaving the silicide regions 27 and 29. In accordance with some special and non-limiting illustrative examples, the silicide regions 27 and 29 may comprise NiSi.

In accordance with some alternative embodiments of the present disclosure (not illustrated, where no epi region 23 is formed), the person skilled in the art will appreciate that, in the SOI region 1, the silicide regions 27 for contacting the source/drain regions may be formed in and on the active semiconductor layer 15, while silicide regions 29 may be formed on the bulk exposed region 19 within the trench 17.

Figure 1G:
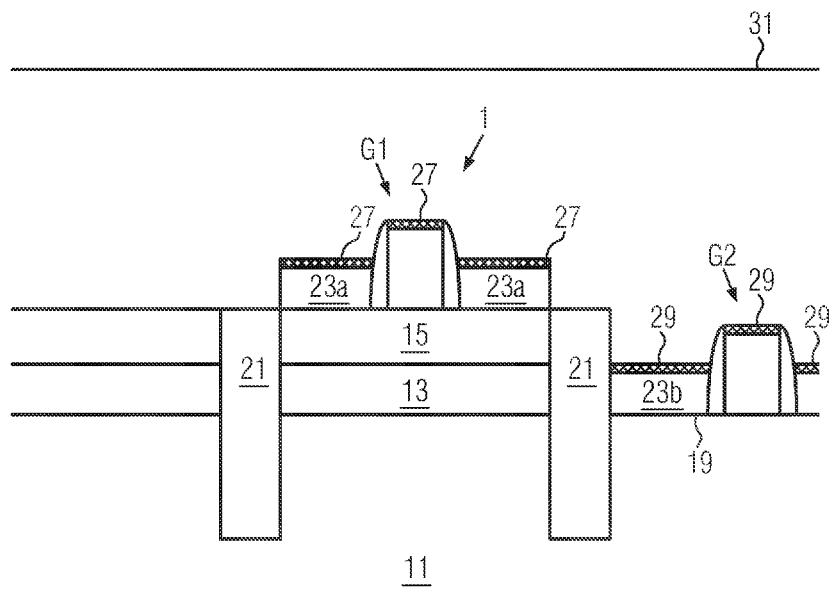

With regard to FIG. 1g, the structure as described above with regard to FIG. 1f is schematically illustrated at a more advanced stage during the fabrication after an interlayer dielectric material 31 is deposited over the gate structures G1 and G2. For example, the interlayer dielectric layer 31 may be formed by silicon oxide or a low-k material having a relative dielectric constant k of 3.9 or less.

Figure 1H:
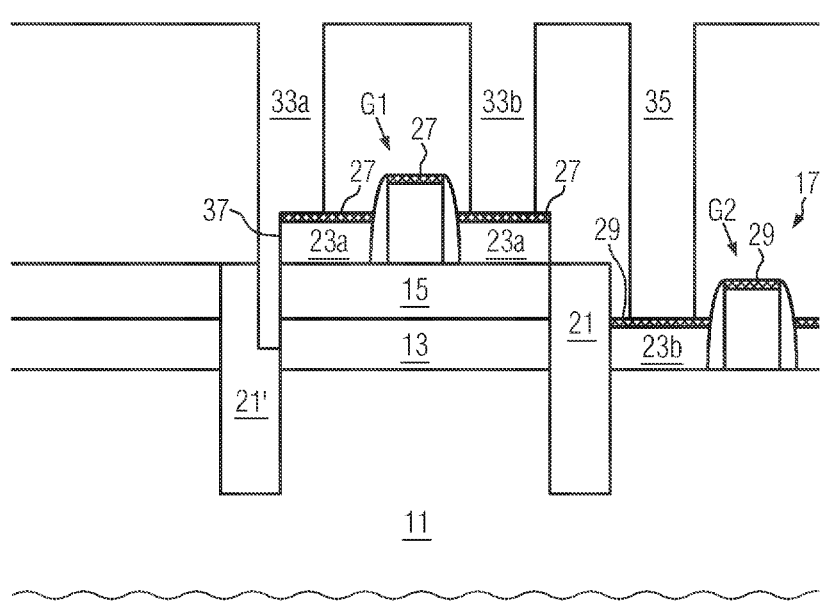

Next, a contact module having an intentionally misaligned contact may be performed, resulting in the structure illustrated in FIG. 1h. The contact module (not illustrated) may comprise depositing an interlayer dielectric (ILD) material 31 on and above the structure as illustrated in FIG. 1f and forming a masking pattern (not illustrated) on the deposited ILD material 31 to obtain a patterned ILD material 31, as illustrated in FIG. 1h. The patterned ILD material 31 (in FIG. 1h) may have contact trenches 33a, 33b for partially exposing an upper surface of the silicide region 27 on the raised source/drain regions 23a, and contact trenches 35 (FIG. 1h only shows one) for partially exposing upper surfaces of the silicide regions 29 on the raised source/drain regions 23b. Due to the misalignment, a first contact trench 33a of the contact trenches 33a, 33b may be misaligned relative to the silicide region 27 on the epi region 23a such that a sidewall 37 of the epi region 23a (including a sidewall of the active semiconductor layer 15 in FIG. 1h) may be exposed. Furthermore, a sidewall of the buried insulating material layer 13 underneath the silicide region 27 may be partially exposed within the misaligned trench 33a. As a result of the contact module at the stage illustrated in FIGS. 1g and 1h, the epi region 23a and the active semiconductor layer 15 (on the left-hand side in FIG. 1h) may not be in contact with a trench isolation structure 21', that is, the trench isolation structure 21' may be isolated from the epi region 23a and the active semiconductor layer 15, respectively.

In accordance with some illustrative embodiments of the present disclosure, the misalignment may only apply to the contact trench 33a or may concern at least the contact trenches 33a and 33b.

Figure 1I:
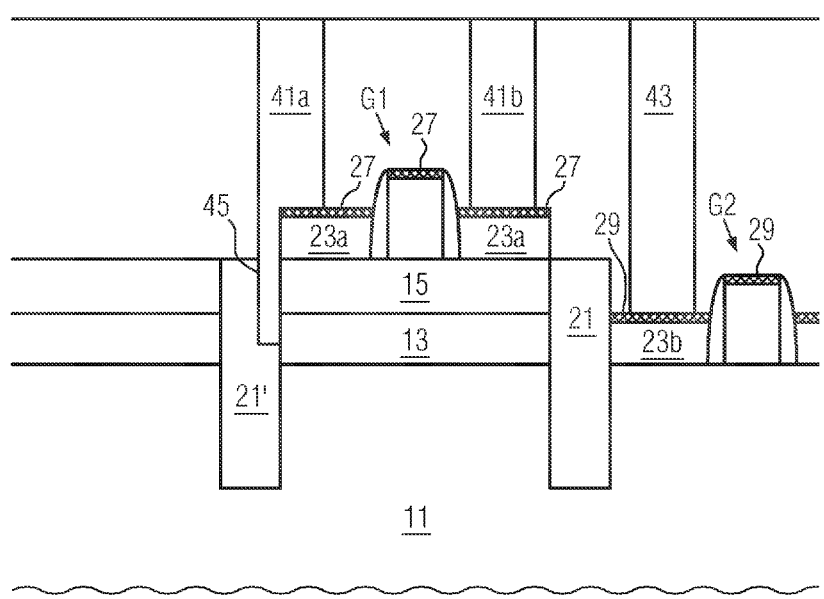

Next, as illustrated in FIG. 1i, the contact trenches 33a, 33b and 35 may be filled with a contact-forming material, resulting in contacts 41a, 41b and 43. Due to the misalignment of the contact trench 33a relative to the epi region 23a, the contact 41a may be misaligned relative to the epi region 23a. As a consequence, the contact 41a may have a tip portion 45 extending through the active semiconductor layer 15 and into the buried insulating material layer 13. Particularly, the trench isolation structure 21 may be isolated from the active semiconductor layer 15 (that is, not in physical contact with the active semiconductor layer 15) due to the tip portion 45 being formed between the isolation structure 21' and the active semiconductor layer 15. The person skilled in the art will appreciate from the schematic illustration in FIG. 1i that, according to the cross-sectional view in FIG. 1i, the tip portion 45 may be in contact with the trench isolation structure 21' at two sides of the tip portion 45. Accordingly, a separation between the contact 41a and the base substrate 11 is reduced because of the tip portion 45 extending down into the buried insulating material layer 13.

In accordance with some illustrative embodiments of the present disclosure, a test structure may be provided in a scribe line of a wafer by the structure illustrated in FIG. 1i obtained in performing the process as described above with regard to FIGS. 1a-1i. The test structure may allow performing voltage breakdown measurements by measuring a breakdown voltage between the contact 41a and base substrate 11, i.e., a voltage at which the buried insulating material layer 13 between the tip portion 45 and the base substrate material breaks down.

In accordance with some illustrative embodiments of the present disclosure, an array of "CA punch down" contacts corresponding to the contact 41a in FIG. 1i may be formed in one or more scribe lines of a wafer, that is, multiple test structures may be formed in an SOI substrate, for example, more than 100 test structures or more than 1000 test structures may be provided in the SOI substrate 10.

The person skilled in the art will appreciate that the test structure may correspond to a contact module with intentionally misaligned CA contacts forming an underlap of the contact 41a with respect to the epi region 23a. The etching of the contact trench 33a in FIG. 1h may form the tip portion 45 inducing the CA punch down.

The person skilled in the art will appreciate that the formation of the contact 43 may be performed at different positions in the process flow. Accordingly, the embodiments as described above are only illustrative with regard to the formation of the contact 43 and, the person skilled in the art will appreciate that the formation of the bulk exposed region 19 may take place at a different position in the process flow, such as after the epi region 23a is formed.

In accordance with some illustrative embodiments of the present disclosure, voltage breakdown measurements may result in voltage breakdown measurement data, which may be saved in a database having voltage breakdown comparison data. For example, possible misaligned CA contacts may be identified by comparing a voltage between at least one CA contact and at least one back gate of at least one FDSOI structure under fabrication with the database. Therefore, on the basis of the voltage breakdown comparison data, the risk of at least one contact CA of at least one semiconductor device under fabrication to possibly cause a short or represent a weak spot for voltage breakdown may be identified.

In accordance with some illustrative embodiments of the present disclosure, wafers may be tested by using at least one test structure for identifying failing semiconductor devices due to misaligned source/drain contacts. Failing semiconductor devices may lead to failing bins which may be identified and marked with a small dot of ink in the middle of the identified failing die, or the information of voltage breakdown measurement(s) is stored in a file, a so-called wafermap. This map may categorize the failing dies by making use of bins. A bin may then be defined as a good or bad die. The wafermap may then be sent to a die attachment process which may then only pick up non-failing circuits by selecting the bin number of good dies. When ink dots are used, vision systems on subsequent die handling equipment may disqualify failing dies by recognizing the ink dots. In some exemplary cases, a die having some (but not all) failing test structures may still be used as a product, typically with limited functionality, for example, as a microprocessor for which only one part of the on-die cache memory may be functional. In this case, the processor may be sold as a lower cost part with a smaller amount of memory and thus lower performance. Additionally, when bad dies have been identified, the die from the bad bin may be used by production personnel for assembly line setup.

In accordance with some illustrative embodiments of the present disclosure, voltage breakdown measurements as described above may allow associating breakdown voltage to dies and to accordingly map dies on a wafer via associated test structures that are manufactured in parallel with respective dies. The test structures may be formed in scribe lines and thus be removed in BEOL process flows without the need to perform additional process steps and to provide additional space on a wafer. Furthermore, voltage breakdown measurements as described above allow identifying processes that may possibly lead to inappropriate breakdown voltages.

Further illustrative embodiments of the present disclosure will be described with regard to FIGS. 2a-2g below.

Figure 2A:
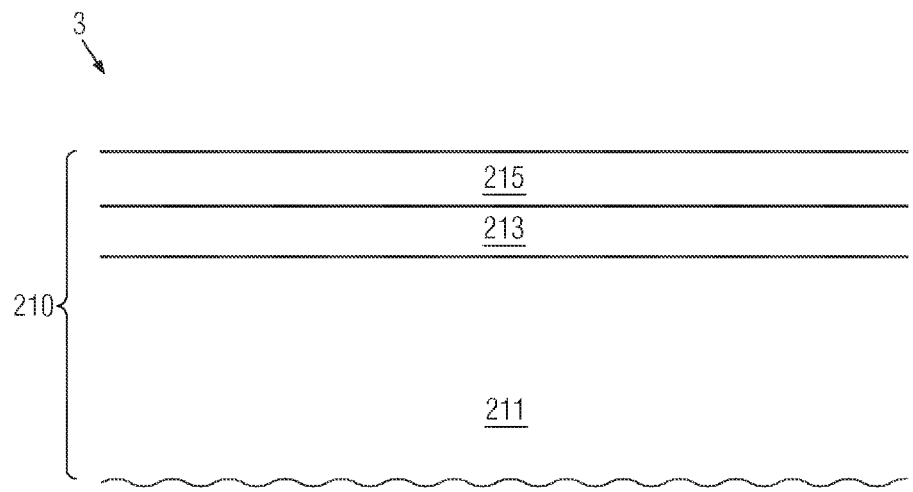
FIGS. 2a-2g schematically illustrate, in a cross-sectional view, a process of forming a test structure in accordance with other illustrative embodiments of the present disclosure.

FIG. 2a schematically illustrates an SOI substrate 210 which is provided by a base substrate 211, a buried insulating material layer 213 and an active semiconductor layer 215. Herein, the active semiconductor layer 215 is formed on the buried insulating material layer 213, which, in turn, is disposed on the base substrate 211. The SOI substrate 210 may be, for example, formed in accordance with known techniques, such as smart cut or SIMOX fabrication processes. In accordance with some illustrative embodiments of the present disclosure, the active semiconductor layer 215 may have eSiGe regions as is explained above with regard to the active semiconductor layer 15.

In accordance with an illustrative example, the active semiconductor layer 215 may be provided by a semiconductor material, e.g., silicon or silicon germanium. In accordance with some examples, the active semiconductor layer 215 may have a thickness in a range from about 5-10 nm. In accordance with some illustrative embodiments of the present disclosure, the buried insulating material 213 may be a silicon oxide material and may have a thickness in a range from about 10-30 nm, alternatively, the thickness may be in a range from about 130-160 nm, e.g., at about 149 nm. In accordance with some illustrative embodiments, the base substrate 211 may be formed by silicon or any other appropriate semiconductor material used as a bulk substrate material.

Figure 2B:
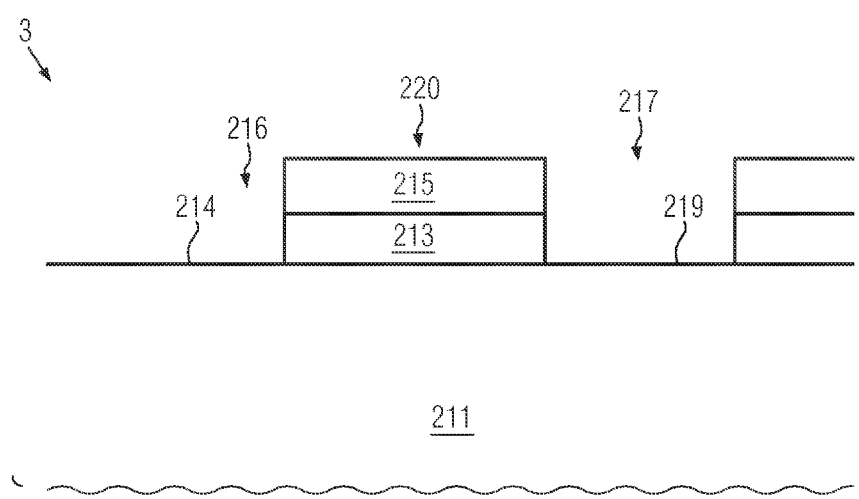

FIG. 2b schematically illustrates the SOI substrate 210 of FIG. 3a at a more advanced stage during fabrication after bulk exposed regions 214 and 219 are formed, the bulk exposed regions 214, 219 being separated by an active region portion 220, the active region portion 220 being formed from the buried insulating material 213 and the active semiconductor layer 215. In accordance with some illustrative embodiments of the present disclosure, the active region portion 220 may be formed in accordance with standard STI modules being performed so as to provide an active region portion comprising buried insulating material and active semiconductor material, on which active region portion at least one gate structure (not illustrated) is to be subsequently formed.

In accordance with some illustrative examples, the bulk exposed regions 214 and 219, which partially expose an upper surface of the base substrate 211, may be formed by appropriately masking the SOI substrate 210 in FIG. 2a and by removing the buried insulating material layer 213 and the active semiconductor layer 215 in accordance with the masking, for example, by applying an anisotropic etching process for etching trenches 216 and 217 into the active semiconductor layer 215 and the buried insulating material layer 213. The bulk exposed regions 216 and 219 represent respective bottoms of the trenches 216 and 217.

Figure 2C:
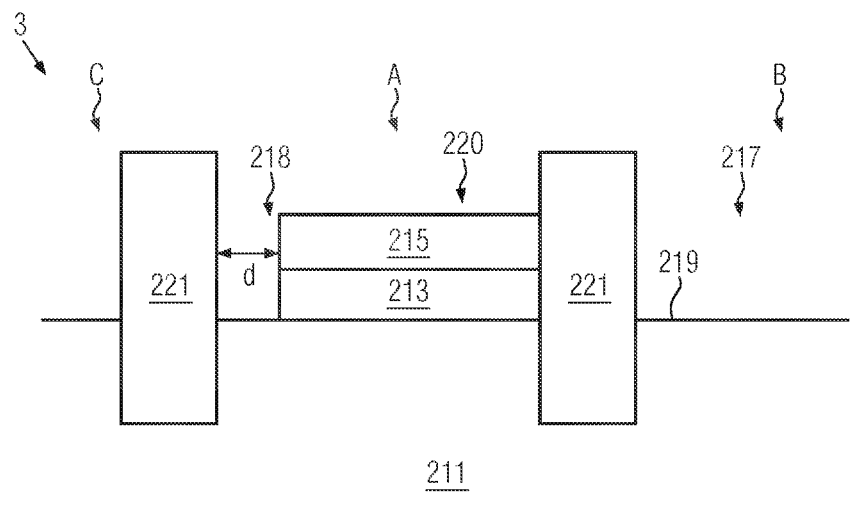

FIG. 2c schematically illustrates the SOI substrate 210 of FIG. 2b at a more advanced stage during fabrication after a trench isolation structure 221 is formed and active regions A, B and C are defined. In accordance with some illustrative embodiments of the present disclosure, the trench isolation structure 221 is formed within the trench 216 (FIG. 2b) such that the exposed region 214 is partially covered by the trench isolation structure 221 and a trench 218 of a smaller width d representing a spacing between the trench isolation structure 221 and the active region portion 220 is formed. The trench isolation structure 221 may be formed in accordance with known shallow trench isolation (STI) techniques by etching trenches into the SOI substrate and filling the trenches with an insulating material, e.g., one of silicon oxide and silicon nitride. In accordance with some illustrative embodiments, the active region A may represent an FDSOI region and the active regions B and C may represent BULEX regions. Alternatively, at least one of the regions B and C may be provided as an FDSOI region in addition to the active region A. The person skilled in the art will appreciate that, in accordance with some illustrative embodiments of the present disclosure, at least one of the regions A, B and C may be formed at locations where scribe lines are to be provided.

In accordance with some illustrative embodiments, at least the active region A out of the active regions A, B and C may be exposed to fabrication steps in which gate structures (not illustrated) are formed. According embodiments will be described with regard to FIG. 3 below.

Figure 2D:
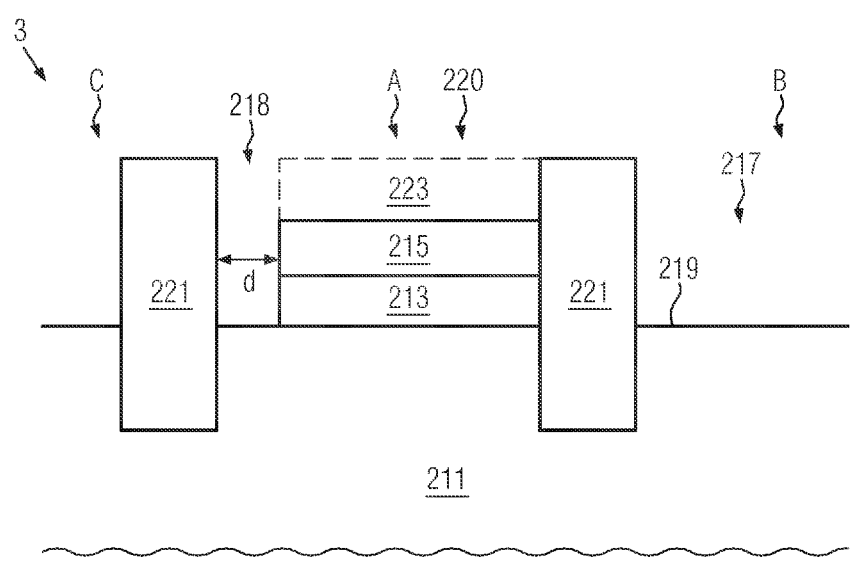

FIG. 2d schematically illustrates the structure as depicted in FIG. 2c at a more advanced stage during fabrication after (possibly at least one gate structure was formed and) a possible epitaxial growth process was performed in order to epitaxially grow a semiconductor material on the active region portion 220, particularly on the active semiconductor layer 215. In accordance with some illustrative embodiments, an epi region 223 may be formed on the active semiconductor layer 215 as indicated by the broken lines in FIG. 2d. In accordance with some illustrative embodiments herein, one of silicon, silicon germanium and silicon carbide may be formed on the active semiconductor layer 215. This, however, poses no limitation to the present disclosure and the person skilled in the art will appreciate that the process as described above with regard to FIG. 2*d* is optional and may be omitted in some illustrative embodiments of the present disclosure.

In accordance with some illustrative embodiments of the present disclosure, when fabricating epi regions for PMOS and NMOS devices, processes comprise forming a block mask layer (not illustrated) to separate the process flows for fabricating epi regions of N-type (NMOS devices) and epi regions of P-type (PMOS devices). Herein, the trench 218 may be blocked during both epi processes and formation of epi material within the trench 218 may be suppressed.

Figure 2E:
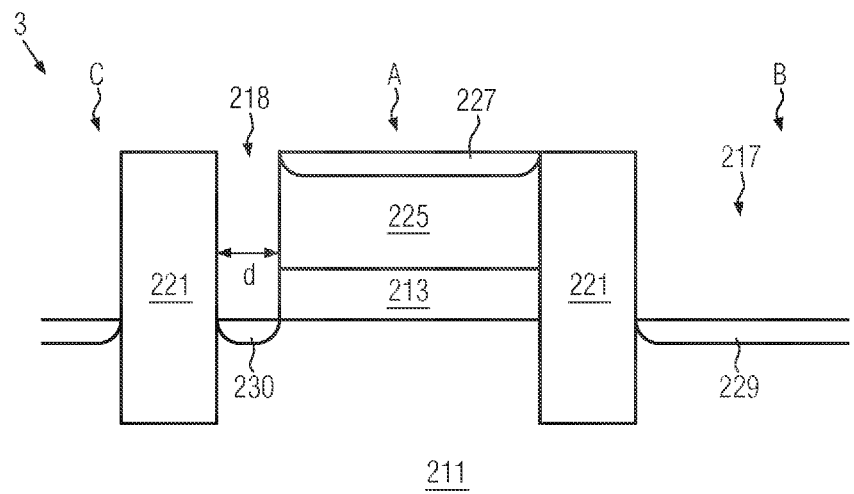

With regard to FIG. 2*e*, the structure as described above with regard to FIG. 2*d* is schematically illustrated at a more advanced stage during the fabrication after a salicidation (self-aligned silicidation) process (not illustrated) is performed and completed. As a result, silicide regions 227, 229 and 230 may be formed in and on the epi region 225 (on the active semiconductor layer 215 in case that no epitaxial growth is performed) and the base substrate 211 in the trenches 217 and 218. In some illustrative embodiments of the present disclosure, the salicidation process may comprise a step of depositing a metal material (not illustrated) over the structure as illustrated in FIG. 2*d* and, subsequently, performing an annealing process for forming the silicide regions 227, 229 and 230 by inducing a reaction of semiconductor material with the deposited metal material (not illustrated). Subsequently, an etching process may be performed for removing the unreacted metal material, leaving the silicide regions 227 and 229. In accordance with some special and non-limiting illustrative examples, the silicide regions 227, 229 and 230 may comprise NiSi.

In accordance with some alternative embodiments of the present disclosure (not illustrated, where no epi region 225 is formed), the person skilled in the art will appreciate that the silicide region 227 may be formed in and on the active semiconductor layer 215 (FIG. 2*c*).

Figure 2F:
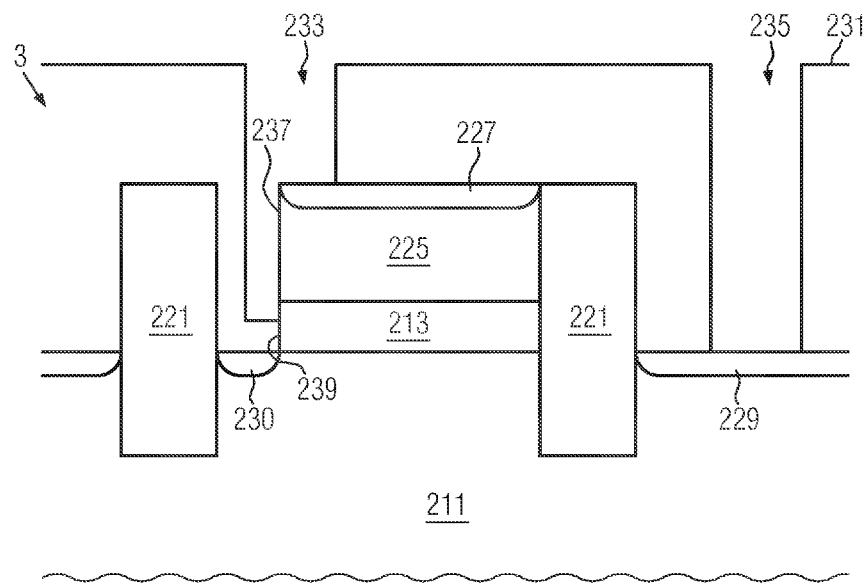

Next, as illustrated in FIG. 2*f*, a contact module with intentionally misaligned contacts may be performed, resulting in the structure illustrated in FIG. 2*f*. The contact module (not illustrated) may comprise depositing an interlayer dielectric (ILD) material on and above the structure as illustrated in FIG. 3*e* and forming a masking pattern (not illustrated) on the deposited ILD material (not illustrated) to obtain a patterned ILD material 231, as illustrated in FIG. 3*f*. The patterned ILD material 231 may have a first contact trench 233 for partially exposing an upper surface of the silicide region 227, and a second contact trench 235 for partially exposing an upper surface of the silicide region 229. Due to the misalignment, the first contact trench 233 may be misaligned relative to the silicide region 227 and the epi region 225, respectively, such that a sidewall 237 of the epi region 225 (including a sidewall of the active semiconductor layer 215 in FIG. 3*c*) may be exposed. Furthermore, a sidewall of the buried insulating material layer 213 underneath the silicide region 227 may be partially exposed. As a result of the contact module at the stage illustrated in FIG. 2*f*, the epi region 225 and the active semiconductor layer 215 (FIG. 2*c*) may not be in contact with the trench isolation structure 221, that is, the trench isolation structure 221 may be isolated from the epi region 225 and the active semiconductor layer 215, respectively.

Figure 2G:
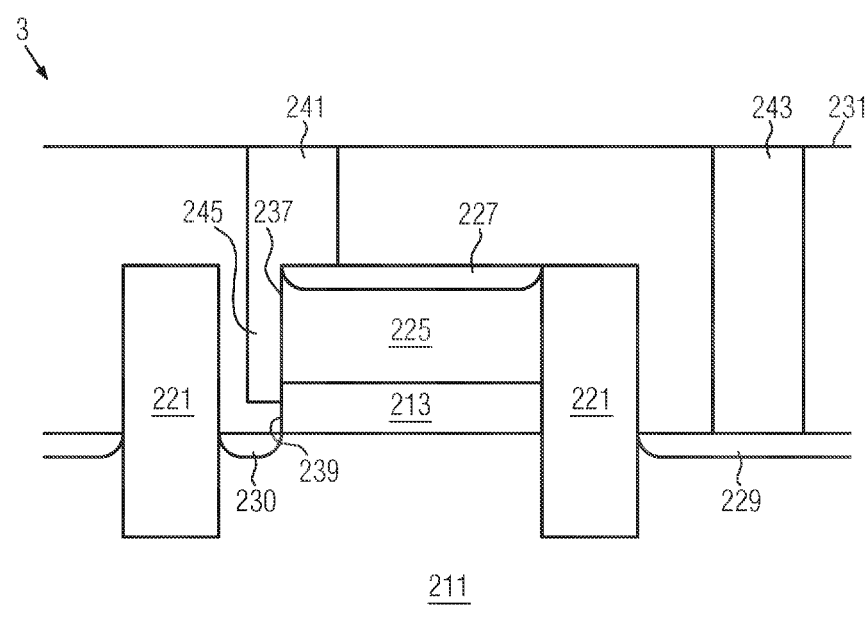

Next, as illustrated in FIG. 2*g*, the first and second contact trenches 233 and 235 (FIG. 2*f*) may be filled with a contact-forming material, resulting in contacts 241 and 243. Due to the misalignment of the first contact trench 233 relative to the epi region 225, the contact 241 may be misaligned relative to the epi region 225. As a consequence, the contact 241 may have a tip portion 245 extending down towards the silicide region 230 along a sidewall surface of the active region portion 225 and the buried insulating material layer 213. In cases where the tip portion 245 extends partially along the sidewall surface 239 of the buried insulating material 213, and particularly does not extend down to the silicide region 230, the tip portion 245 may be used for measuring a weak point for breakdown. Otherwise, when extending down to the silicide region 230, a short is formed.

In accordance with some illustrative embodiments of the present disclosure, the trench isolation structure 221 may be isolated from the active semiconductor layer 215 (that is, not in physical contact with the active semiconductor layer 215) due to the tip portion 245 being formed between the isolation structure 221 and the active semiconductor layer 215. The person skilled in the art will appreciate from the schematic illustration in FIG. 2*g* that according to the cross-sectional view in FIG. 2*g*, the tip portion 245 may be in contact with the ILD material 231 at two sides of the tip portion 245.

In accordance with some illustrative embodiments of the present disclosure, a test structure 3 may be provided by the structure illustrated in FIG. 2*g* obtained in performing the process as described above with regard to FIGS. 2*a*-2*g*. The test structure 3 may allow performing voltage breakdown measurements by measuring a breakdown voltage of the buried insulating material layer 213 at the tip portion 245.

In accordance with some illustrative embodiments of the present disclosure, an array of "CA punch down" contacts corresponding to the contact 241 in FIG. 2*g* may be formed in at least one scribe line of a wafer, that is, multiple test structures 3 may be formed in an SOI substrate, for example, more than 100 test structures 3 or more than 1000 test structures 3 may be provided in the SOI substrate 210.

The person skilled in the art will appreciate that the test structure 3 may correspond to a contact module with intentionally pulled back active region portion 220, e.g., with intentionally pulled back epi region 225. The etching of the contact trench 241 in FIG. 2*f* may form the tip portion 245 inducing the CA punch down.

The person skilled in the art will appreciate that the formation of the contact 243 may be performed at different positions in the process flow. Accordingly, the embodiments as described above are only illustrative with regard to the formation of the contact 243 and the person skilled in the art will appreciate that the formation of the bulk exposed region 219 may take place at a different position in the process flow, such as after the epi region 225 is formed.

The person skilled in the art will appreciate that a hybrid structure may be formed where SOI device structures are separated from bulk exposed (BULEX) regions via one or more trench isolation structures.

In accordance with some illustrative embodiments of the present disclosure, voltage breakdown measurements may result in voltage breakdown measurement data, which may be saved in a database having voltage breakdown comparison data. For example, possible misaligned CA contacts may be identified by comparing a voltage between at least one CA contact and at least one back gate of at least one FDSOI structure under fabrication with the database. Therefore, on the basis of the voltage breakdown comparison data, the risk of at least one contact CA of at least one semiconductor device under fabrication to possibly cause a short or represent a weak spot for voltage breakdown may be identified.

In accordance with some illustrative embodiments of the present disclosure, wafers may be tested by using at least one test structure for identifying failing semiconductor devices due to misaligned source/drain contacts. Failing semiconductor devices may lead to failing bins which may be identified and marked with a small dot of ink in the middle of the identified failing die, or the information of voltage breakdown measurement(s) is stored in a file, a so-called wafermap. This map may categorize the failing dies by making use of bins. A bin may then be defined as a good or bad die. The wafermap may then be sent to a die attachment process which may then only pick up non-failing circuits by selecting the bin number of good dies. When ink dots are used, vision systems on subsequent die handling equipment may disqualify failing dies by recognizing the ink dots. In some exemplary cases, a die having some (but not all) failing test structures may still be used as a product, typically with limited functionality, for example, as a microprocessor for which only one part of the on-die cache memory may be functional. In this case, the processor may be sold as a lower cost part with a smaller amount of memory and thus lower performance. Additionally when bad dies have been identified, the die from the bad bin may be used by production personnel for assembly line setup.

In accordance with some illustrative embodiments of the present disclosure, voltage breakdown measurements as described above may allow associating breakdown voltage to dies and to accordingly map dies on a wafer via associated test structures that are manufactured in parallel with respective dies. The test structures may be formed in scribe lines and thus be removed in BEOL process flows without the need to perform additional process steps and to provide additional space on a wafer. Furthermore, voltage breakdown measurements as described above allow identifying processes that may possibly lead to inappropriate breakdown voltages.

Figure 3:
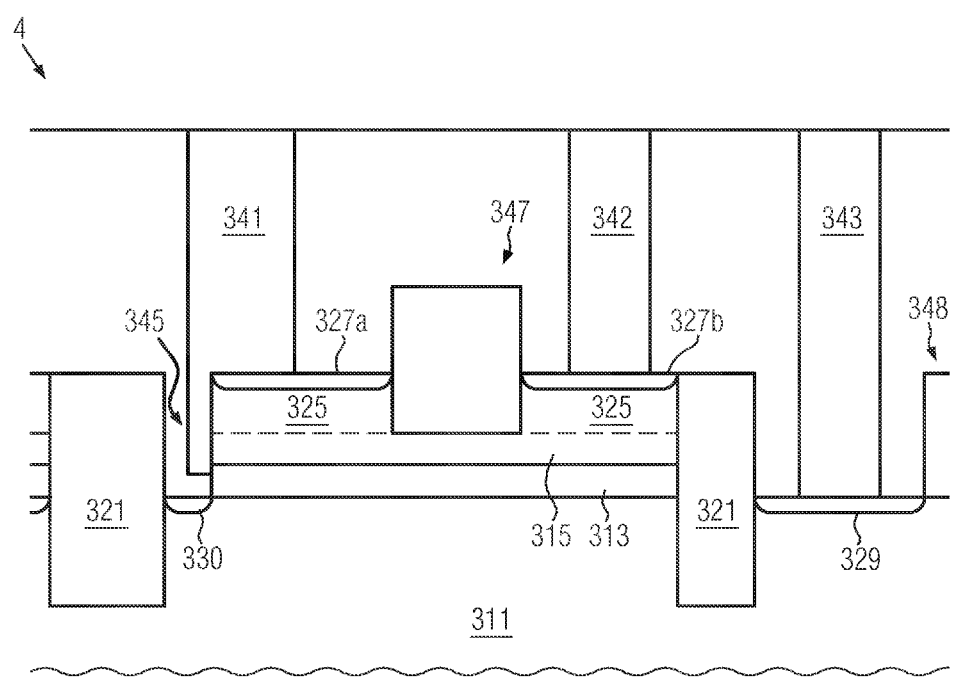
FIG. 3 schematically illustrates, in a cross-sectional view, a modification of the test structure illustrated in FIG. 2g.

With regard to FIG. 3, a hybrid structure 4 in accordance with alternative embodiments of the present disclosure is schematically illustrated, in which a gate structure is formed in the active region subsequent to the process step as illustrated in FIG. 2c. That is, the hybrid structure which is accordingly obtained and as illustrated in FIG. 3 differs from the structure 3 as illustrated in FIG. 2g in that a gate structure 347 (including spacers, gate dielectric materials, gate electrode materials etc.) and a gate structure 348 (including spacers, gate dielectric materials, gate electrode materials etc.) are formed prior to the epitaxial growth of the epi material 223 in FIG. 2d. Additionally, an epi region may be formed in the BULEX region on which the gate structure 348 is formed. The SOI region and the BULEX region are separated in FIG. 3 by at least one trench isolation structure 321.

In accordance with some illustrative embodiments, the raised source/drain regions 325 may be formed after formation of the gate structure 347. Contacts 341 and 343 corresponding to contacts 241 and 243 in FIG. 2g may be subsequently formed, particularly after the formation of silicide regions 327a, 327b and 329 (corresponding to the silicide regions 227 and 229 in FIG. 2g), where silicide contacts to the gate structures 347 and 348 are not illustrated. Similar to the contact 241 in FIG. 2g, the contact 341 in FIG. 3 may have a tip portion 345. The tip portion 345 may separate a trench isolation structure 321 from the raised source/drain region 325 and an active semiconductor layer 315. The person skilled in the art will appreciate that the contact 343 may serve as a back gate contact for back biasing a base substrate provided below a buried insulating material layer 313.

Although raised source/drain regions 23a and 325 in FIGS. 1i and 3, and epi regions 23b and 225 in FIGS. 1i and 2g were formed, this does not pose any limitation to the present disclosure and the formation of raised source/drain regions and epi regions, respectively, may be blocked for enhancing the formation of the "CA punch down."

The person skilled in the art will appreciate that, in the framework of the embodiments described above with regard to FIGS. 2a-2g and 3, accordingly-provided configurations have the risk that the accordingly-formed "CA punch down" may shorten with the back gate, i.e., the tip portions 245 and 345 in FIGS. 2g and 3 may be in electrical contact with the silicide regions 230 and 330 in FIGS. 2g and 3.

In summary, the present disclosure discloses test structures which allow measuring a "CA punch down" providing the risk of a possible back gate voltage breakdown. Particularly, the test structures of the present disclosure enable reliable monitoring of semiconductor devices fabricated in accordance with FDSOI techniques for CA punch down.

The person skilled in the art will appreciate that the test structures and the disclosed monitoring need no additional mask layer to realize the test structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A test structure, comprising:
    an SOI substrate having an active semiconductor layer, a buried insulating material layer, and a base substrate, wherein said active semiconductor layer is formed on said buried insulating material layer, which is in turn formed on said base substrate; and
    a contact which is formed on said active semiconductor layer and electrically coupled to said active semiconductor layer;
    wherein said contact has a tip portion extending through said active semiconductor layer into said buried insulating material layer and said test structure is formed in a scribe line of a wafer.

2. The test structure of claim 1, further comprising an epi region epitaxially formed on said active semiconductor layer and a silicide region provided in and on said epi region, wherein said contact contacts said silicide region and said tip portion extends through said epi region.

3. The test structure of claim 2, wherein said tip portion is laterally shifted relative to said silicide region.

4. The test structure of claim 1, further comprising an STI element formed at one side of said active semiconductor layer and being separated from said active semiconductor layer by said contact, said contact at least partially separating said STI element from said buried insulating material layer.

5. The test structure of claim 4, wherein, in a cross-sectional view, said tip portion is at two sides in contact with said STI element.

6. The test structure of claim 4, wherein, in a cross-sectional view, said tip portion is at two sides in contact with said buried insulating material layer.

7. The test structure of claim 1, further comprising a gate structure formed above said active semiconductor layer at one side of said contact, and raised source/drain regions formed at opposing sides of said gate structure, wherein one of said raised source/drain regions disposed between said gate structure and said contact is smaller in size along a direction connecting said contact and said gate structure than said other of said raised source/drain regions.

8. The test structure of claim 1, further comprising a back contact in contact with said base substrate in a bulk exposed region (BULEX region) adjacent to said contact, and a measuring means electrically connected to said contact and said back contact, said measuring means being configured to measure a breakdown voltage of said buried insulating material layer between said contact and said back contact.

9. A test structure, comprising:
an SOI substrate having an active semiconductor layer, a buried insulating material layer, and a base substrate, wherein said active semiconductor layer is formed on said buried insulating material layer, which is in turn formed on said base substrate;
a contact which is formed on said active semiconductor layer and electrically coupled to said active semiconductor layer, said contact having a tip portion which extends through said active semiconductor layer into said buried insulating material layer;
an STI element formed at one side of said active semiconductor layer and being separated from said active semiconductor layer by said contact, said contact at least partially separating said STI element from said buried insulating material layer; and
an epi region epitaxially formed on said active semiconductor layer and a silicide region provided in and on said epi region, wherein said contact contacts said silicide region and said tip portion extends through said epi region;
wherein said tip portion is laterally shifted relative to said silicide region.

10. The test structure of claim 9, further comprising a gate structure formed above said active semiconductor layer at one side of said contact, and a further epi region epitaxially formed on said active semiconductor layer, said epi region and said further epi region being formed at opposing sides of said gate structure, wherein said epi region is smaller in size along a direction connecting said contact and said gate structure than said further epi region.

11. The test structure of claim 9, wherein, in a cross-sectional view, said tip portion is at two sides in contact with said STI element.

12. The test structure of claim 9, wherein, in a cross-sectional view, said tip portion is at two sides in contact with said buried insulating material layer.

13. The test structure of claim 9, further comprising a back contact in contact with said base substrate in a bulk exposed region (BULEX region) adjacent to said contact and a measuring means electrically connected to said contact and said back contact, said measuring means being configured to measure a breakdown voltage of said buried insulating material layer between said contact and said back contact.

14. A test structure, comprising:
an SOI substrate having an active semiconductor layer, a buried insulating material layer, and a base substrate, wherein said active semiconductor layer is formed on said buried insulating material layer, which is in turn formed on said base substrate;
a contact which is formed on said active semiconductor layer and electrically coupled to said active semiconductor layer, wherein said contact has a tip portion extending through said active semiconductor layer into said buried insulating material layer; and
an STI element formed at one side of said active semiconductor layer and being separated from said active semiconductor layer by said contact, said contact at least partially separating said STI element from said buried insulating material layer.

15. The test structure of claim 14, further comprising an epi region epitaxially formed on said active semiconductor layer and a silicide region provided in and on said epi region, wherein said contact contacts said silicide region and said tip portion extends through said epi region.

16. The test structure of claim 14, wherein, in a cross-sectional view, said tip portion is at two sides in contact with said STI element.

17. The test structure of claim 14, wherein, in a cross-sectional view, said tip portion is at two sides in contact with said buried insulating material layer.

18. The test structure of claim 14, further comprising a gate structure formed above said active semiconductor layer at one side of said contact, and raised source/drain regions formed at opposing sides of said gate structure, wherein one of said raised source/drain regions disposed between said gate structure and said contact is smaller in size along a direction connecting said contact and said gate structure than said other of said raised source/drain regions.

19. The test structure of claim 14, further comprising a back contact in contact with said base substrate in a bulk exposed region (BULEX region) adjacent to said contact, and a measuring means electrically connected to said contact and said back contact, said measuring means being configured to measure a breakdown voltage of said buried insulating material layer between said contact and said back contact.

20. A test structure, comprising:
an SOI substrate having an active semiconductor layer, a buried insulating material layer, and a base substrate, wherein said active semiconductor layer is formed on said buried insulating material layer, which is in turn formed on said base substrate;
a contact which is formed on said active semiconductor layer and electrically coupled to said active semiconductor layer, wherein said contact has a tip portion extending through said active semiconductor layer into said buried insulating material layer; and
a gate structure formed above said active semiconductor layer at one side of said contact, and raised source/drain regions formed at opposing sides of said gate structure, wherein one of said raised source/drain regions disposed between said gate structure and said contact is smaller in size along a direction connecting said contact and said gate structure than said other of said raised source/drain regions.

21. The test structure of claim 20, further comprising a back contact in contact with said base substrate in a bulk exposed region (BULEX region) adjacent to said contact, and a measuring means electrically connected to said contact and said back contact, said measuring means being configured to measure a breakdown voltage of said buried insulating material layer between said contact and said back contact.

* * * * *